(12) United States Patent
Zhao (10) Patent No.: US 12,336,354 B2
(45) Date of Patent: Jun. 17, 2025

(54) LIGHT-EMITTING DIODE DISPLAY PANEL, MANUFACTURING METHOD THEREOF, AND DISPLAY DEVICE

(71) Applicant: TCL CHINA STAR OPTOELECTRONICS TECHNOLOGY CO., LTD., Shenzhen (CN)

(72) Inventor: Yongchao Zhao, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/772,759

(22) PCT Filed: Apr. 22, 2022

(86) PCT No.: PCT/CN2022/088410
§ 371 (c)(1),
(2) Date: Apr. 28, 2022

(87) PCT Pub. No.: WO2023/193308
PCT Pub. Date: Oct. 12, 2023

(65) Prior Publication Data
US 2024/0170627 A1    May 23, 2024

(30) Foreign Application Priority Data
Apr. 7, 2022    (CN) .................. 202210364842.X (51) Int. Cl.
*H10H 20/85*    (2025.01)
*H01L 25/075*    (2006.01)
(Continued)

(52) U.S. Cl.
CPC ....... *H10H 20/857* (2025.01); *H01L 25/0753* (2013.01); *H01L 25/167* (2013.01);
(Continued)

(58) Field of Classification Search
CPC ... H01L 33/62; H01L 25/0753; H01L 25/167; H01L 33/486; H01L 33/54;
(Continued)

(56) References Cited

U.S. PATENT DOCUMENTS

| 2012/0187436 A1* | 7/2012 | Chen ..................... H01L 33/486 |
| | | 257/E33.059 |
| 2019/0131281 A1* | 5/2019 | Liu ......................... H01L 33/38 |
| 2019/0301709 A1* | 10/2019 | Chen ..................... C09K 11/02 |
| 2021/0110761 A1* | 4/2021 | Liu .......................... G09G 3/32 |

(Continued)

FOREIGN PATENT DOCUMENTS

| CN | 109166867 A | 1/2019 |
| CN | 109166949 A | 1/2019 |

(Continued)

OTHER PUBLICATIONS

PCT International Search Report for International Application No. PCT/CN2022/088410, mailed on Dec. 15, 2022, 8pp.

(Continued)

*Primary Examiner* — S M Sohel Imtiaz
(74) *Attorney, Agent, or Firm* — The Roy Gross Law Firm, LLC; Roy D. Gross (57) ABSTRACT

The present application provides an LED display panel, a manufacturing method thereof, and a display device. The LED display panel includes: a substrate, including a pad; a white oil layer; and an LED chip, which is soldered with the pad by a solder paste; wherein the white oil layer includes an opening, the opening penetrates the white oil layer and exposes the pad, an aperture diameter of the opening away from the pad is greater than or equal to an aperture diameter of the opening close to the pad, and the maximum distance (Continued)

between a projection of the sidewall of the opening on the substrate and the adjacent pad is greater than or equal to a thickness of the white oil layer.

18 Claims, 4 Drawing Sheets

(51) Int. Cl.
*H01L 25/16* (2023.01)
*H10H 20/853* (2025.01)
*H10H 20/857* (2025.01)
*H10H 20/01* (2025.01)

(52) U.S. Cl.
CPC ...... *H10H 20/8506* (2025.01); *H10H 20/853* (2025.01); *H10H 20/0364* (2025.01)

(58) Field of Classification Search
CPC .......... H01L 2933/0066; H01L 25/075; H01L 33/48; H10H 20/857; H10H 20/8506; H10H 20/853; H10H 20/0364; H10H 20/85
See application file for complete search history.

(56) References Cited

U.S. PATENT DOCUMENTS

| | | | |
|---|---|---|---|
| 2021/0119079 A1* | 4/2021 | Hwang | H01L 33/38 |
| 2021/0191174 A1* | 6/2021 | Li | G02F 1/133553 |
| 2022/0068999 A1* | 3/2022 | Lai | H01L 25/0753 |
| 2022/0299823 A1* | 9/2022 | Li | G02F 1/133611 |
| 2023/0155086 A1* | 5/2023 | Lim | H01L 33/0095 257/98 |

FOREIGN PATENT DOCUMENTS

| | | |
|---|---|---|
| CN | 112987397 A | 6/2021 |
| CN | 113629065 A | 11/2021 |
| CN | 113777826 A * | 12/2021 |
| CN | 114203748 A | 3/2022 |

OTHER PUBLICATIONS

PCT Written Opinion of the International Search Authority for International Application No. PCT/CN2022/088410, mailed on Dec. 15, 2022, 7pp.

Chinese Office Action issued in corresponding Chinese Patent Application No. 202210364842.X dated Oct. 25, 2024, pp. 1-10, 23pp.

* cited by examiner

FIG. 3 providing a substrate, wherein the substrate comprises a driving circuit and a pad, the driving circuit is electrically connected to the pad, and the pad is disposed on a surface of the substrate; — S1 forming a white oil layer on the substrate, wherein the white oil layer comprises an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer; — S2 applying a solder paste on the pad by stencil printing; and — S3 providing a light-emitting diode (LED) chip, and welding the LED chip to the pad by reflow soldering. — S4

FIG. 4

FIG. 5

LIGHT-EMITTING DIODE DISPLAY PANEL, MANUFACTURING METHOD THEREOF, AND DISPLAY DEVICE

CROSS REFERENCE TO RELATED APPLICATIONS

This application is a National Phase of PCT Patent Application No. PCT/CN2022/088410 having International filing date of Apr. 22, 2022, which claims the benefit of priority of Chinese Patent Application No. 202210364842.X, filed Apr. 7, 2022, the contents of which are all incorporated herein by reference in their entirety.

BACKGROUND OF INVENTION

Field of Invention

The present application relates to the field of display, and in particular, to a light-emitting diode (LED) display panel, a manufacturing method thereof, and a display device.

Description of Prior Art

Active matrix mini light emitting diode (AM Mini LED) displays have the characteristics of high brightness, strong grayscale, high color saturation, high-definition dynamic picture quality, as well as the unique advantages of easy storage and installation, and can replace traditional monitors, projectors, etc.

The process of AM Mini LED display needs coating of solder paste. The current solder paste coating process mainly adopts the stencil printing method. During the stencil printing process, the stencil is in direct contact with the substrate, and a layer of white oil material is usually spray-coated before the solder paste is applied, to prevent the circuit of the substrate from being crushed, and to improve the brightness of the substrate at the same time.

However, the reflectivity of the white oil film is proportional to the thickness of the white oil. If the thickness of the white oil film is too low, the brightness of the substrate will be insufficient. If the thickness of the white oil film in the window area of the pad is too high, the steel mesh cannot contact the pads on the substrate, resulting in abnormal solder paste printing, which in turn leads to abnormal soldering between the substrate and the LED chip.

SUMMARY OF INVENTION

The present application provides an LED display panel, a manufacturing method thereof, and a display device to solve a problem of abnormal soldering between a substrate and an LED chip.

The present application provides an LED display panel, the LED display panel includes:
- a substrate including a driving circuit and a pad, wherein the driving circuit is electrically connected to the pad, and the pad is disposed on a surface of the substrate;
- a white oil layer disposed on a side of the substrate where the pad is located; and
- a light-emitting diode (LED) chip soldered with the pad by a solder paste;
- wherein the white oil layer includes an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer.

Optionally, in some embodiments of the present application, the maximum distance ranges from 60 μm to 100 μm, and the thickness of the white oil layer ranges from 50 μm to 70 μm.

Optionally, in some embodiments of the present application, the opening includes a first opening and a second opening, the first opening is defined between the second opening and the substrate, and the second opening is defined above the first opening, and an aperture diameter of the second opening is larger than an aperture diameter of the first opening.

Optionally, in some embodiments of the present application, the white oil layer is disposed as a single-layered; or
    the white oil layer includes a first white oil layer and a second white oil layer, the first white oil layer is disposed between the second white oil layer and the substrate, the first opening penetrates the first white oil layer, and the second opening penetrates the second white oil layer.

Optionally, in some embodiments of the present application, a thickness of the first white oil layer is 20-30 μm, and a thickness of the second white oil layer is 20-30 μm.

Optionally, in some embodiments of the present application, the aperture diameter gradually increases in a direction away from the pad.

Optionally, in some embodiments of the present application, the LED display panel further includes a white glue layer, the white glue layer is disposed in the opening and surrounds the LED chip, and the white glue layer fills a gap between the LED chip and the white oil layer.

Optionally, in some embodiments of the present application, a material of the white glue layer includes titanium oxide or silver.

Optionally, in some embodiments of the present application, the LED display panel further includes a transparent encapsulation layer, and the transparent encapsulation layer is disposed on the LED chip and covers the LED chip, the white oil layer, and the substrate.

Optionally, in some embodiments of the present application, method of manufacturing a light-emitting diode (LED) display panel, including:
- providing a substrate, wherein the substrate includes a driving circuit and a pad, the driving circuit is electrically connected to the pad, and the pad is disposed on a surface of the substrate;
- forming a white oil layer on the substrate, wherein the white oil layer includes an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer;
- applying a solder paste on the pad by stencil printing; and
- providing a light-emitting diode (LED) chip, and soldering the LED chip to the pad by reflow soldering.

Optionally, in some embodiments of the present application, the step of forming the white oil layer on the substrate includes:

forming a first white oil layer on the substrate, wherein the first white oil layer includes a first opening, and the first opening penetrates the first white oil layer and exposes the pad; and forming a second white oil layer on the first white oil layer, wherein the second white oil layer includes a second opening, and the second opening penetrates the second white oil layer and is defined above the first opening, wherein a maximum distance between a projection of a sidewall of the first opening on the substrate and the pad is L2, a maximum distance between a projection of a sidewall of the second opening on the substrate and the pad is L1, and L1>L2.

Accordingly, the present application provides a manufacturing method of an LED display panel, the manufacturing method including:

a light-emitting diode (LED) display panel; and a back frame, wherein the display panel is disposed in an accommodating cavity of the back frame;

wherein the LED display panel includes:

a substrate including a driving circuit and a pad, wherein the driving circuit is electrically connected to the pad, and the pad is disposed on a surface of the substrate;

a white oil layer disposed on a side of the substrate where the pad is located; and a light-emitting diode (LED) chip soldered with the pad by a solder paste;

wherein the white oil layer includes an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer.

Optionally, in some embodiments of the present application, the maximum distance ranges from 60 μm to 100 μm, and the thickness of the white oil layer ranges from 50 μm to 70 μm.

Optionally, in some embodiments of the present application, the opening includes a first opening and a second opening, the first opening is defined between the second opening and the substrate, and the second opening is defined above the first opening, and an aperture diameter of the second opening is larger than an aperture diameter of the first opening.

Optionally, in some embodiments of the present application, the white oil layer is disposed as a single-layered; or the white oil layer includes a first white oil layer and a second white oil layer, the first white oil layer is disposed between the second white oil layer and the substrate, the first opening penetrates the first white oil layer, and the second opening penetrates the second white oil layer.

Optionally, in some embodiments of the present application, a thickness of the first white oil layer is 20-30 μm, and a thickness of the second white oil layer is 20-30 μm.

Optionally, in some embodiments of the present application, the aperture diameter gradually increases in a direction away from the pad.

Optionally, in some embodiments of the present application, the LED display panel further includes a white glue layer, the white glue layer is disposed in the opening and surrounds the LED chip, and the white glue layer fills a gap between the LED chip and the white oil layer.

Optionally, in some embodiments of the present application, a material of the white glue layer includes titanium oxide or silver.

Optionally, in some embodiments of the present application, the LED display panel further includes a transparent encapsulation layer, and the transparent encapsulation layer is disposed on the LED chip and covers the LED chip, the white oil layer, and the substrate.

The present application provides an LED display panel, a manufacturing method thereof, and a display device. By designing the white oil layer in the LED display panel to increase a size of an opening of the white oil layer, a maximum distance between a projection of a sidewall of the opening on the substrate and the pad adjacent to the sidewall of the opening is greater than or equal to a thickness of the white oil layer, which facilitates a contact between a stencil and the substrate during a stencil printing process and prevents a problem of abnormal solder paste printing due to an excessive thickness of the white oil layer, thereby preventing a problem of abnormal soldering between the substrate and the LED chip.

BRIEF DESCRIPTION OF DRAWINGS

The technical solutions and other beneficial effects of the present application will be apparent through the detailed description of the specific embodiments of the present application in conjunction with the accompanying drawings.

DETAILED DESCRIPTION OF PREFERRED EMBODIMENTS

To address the problem of abnormal soldering between the substrate and the LED chip in the existing LED display panel, the present application provides a light-emitting diode (LED) display panel to solve this problem.

Figure 1:
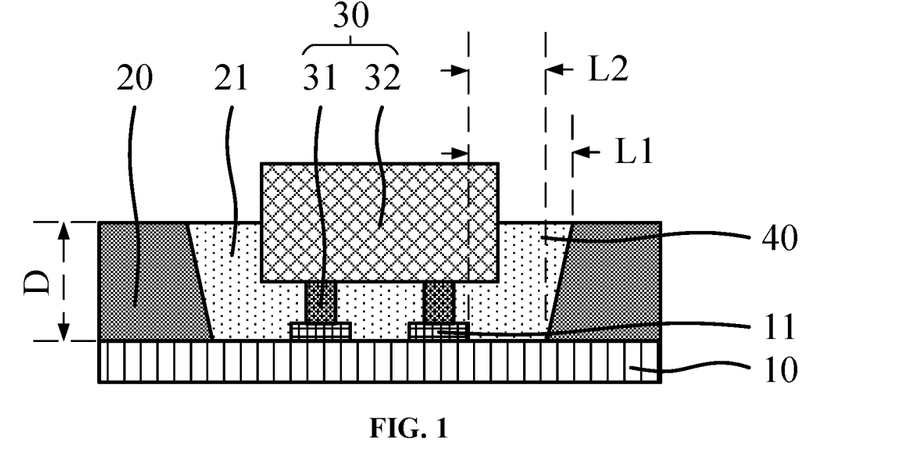
FIG. 1 is a schematic diagram of a first structure of an LED display panel provided by an embodiment of the present application.
Figure 2:
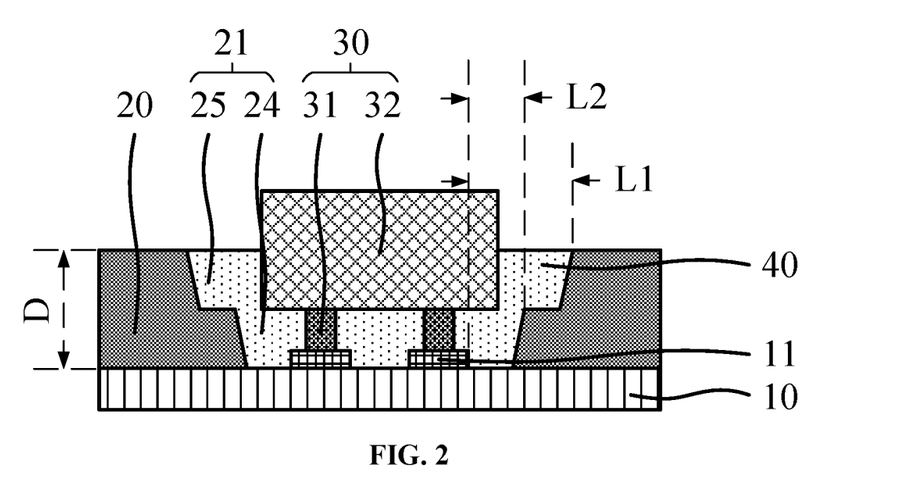
FIG. 2 is a schematic diagram of a second structure of the LED display panel provided by the embodiment of the present application.
Figure 3:
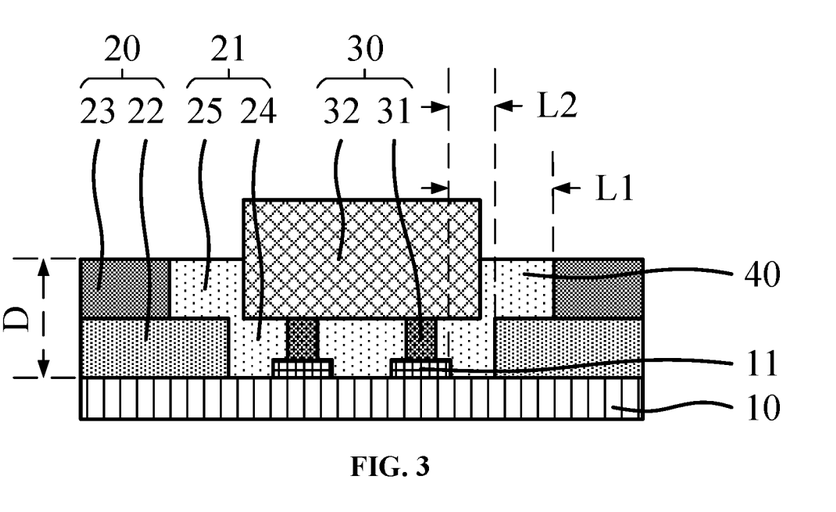
FIG. 3 is a schematic diagram of a second structure of the LED display panel provided by the embodiment of the present application.

In an embodiment, referring to FIG. 1 to FIG. 3, FIG. 1 shows a schematic diagram of a first structure of an LED display panel provided by the embodiment of the present application, FIG. 2 shows the LED display panel provided by the embodiment of the present application, and FIG. 3 shows a schematic diagram of a third structure of the LED display panel provided by the embodiment of the present application. As shown in FIGS. 1 to 3, the LED display panel provided by the embodiment of the present application includes:

a substrate 10 includes a driving circuit (not shown) and a pad 11, wherein the driving circuit is electrically connected to the pad 11, and the pad 11 is located on a surface of the substrate 10;

a white oil layer 20 disposed on a side of the substrate 10 where the pad 11 is located; and The LED chip 30 includes solder pins 31 and a chip 32, wherein the solder pins 31 and the pad 11 are soldered together by a solder paste;

The white oil layer 20 includes an opening 21, the opening 21 penetrates the white oil layer 20 and exposes the pad 11, and an aperture diameter of the opening away from the pad 11 is greater than or equal to an aperture diameter of the opening close to the pad 11, and a maximum distance L1 between a projection of a sidewall of the opening on the substrate 10 and the pad adjacent to the sidewall of the opening 21 is greater than or equal to a thickness D of the white oil layer 20.

In the present application, by designing the white oil layer in the LED display panel to increase a size of an opening of the white oil layer, a maximum distance between a projection of a sidewall of the opening on the substrate and the pad adjacent to the sidewall of the opening is greater than or equal to a thickness of the white oil layer, which facilitates a contact between a stencil and the substrate during a stencil printing process and prevents a problem of abnormal solder paste printing due to an excessive thickness of the white oil layer, thereby preventing a problem of abnormal soldering between the substrate and the LED chip.

In order to meet the brightness requirement of the LED display panel, the reflectivity of the white oil layer 20 is generally greater than 90%, and the reflectivity of the white oil layer 20 is proportional to the thickness of the white oil layer 20. The thickness D of the white oil layer 20 usually ranges from 50 μm to 70 μm, and the maximum distance L1 between the projection of the sidewall of the opening of the white oil layer 20 on the substrate 10 and the pad 11 ranges from 60 μm to 100 μm. Furthermore, since an aperture diameter of the opening away from the pad 11 is greater than or equal to an aperture diameter of the opening close to the pad 11. In FIGS. 1 to 3, it means that a horizontal distance L1 between an upper edge of the sidewall of the opening 21 and the pad 11 ranges from 60 μm to 100 μm.

In an embodiment, referring to FIG. 1, the white oil layer 20 is a single-layered structure, and the aperture diameters of the openings 21 are the same everywhere or the aperture diameters of the openings gradually increase in a direction away from the pad 11. The horizontal distance L1 from the upper edge of the sidewall of the opening 21 to the pad 11 is in a range of 60 μm to 100 μm, and the horizontal distance L2 from a lower edge of the sidewall of the opening 21 to the pad 11 is greater than 20 μm.

In another embodiment, referring to FIG. 2, the white oil layer 20 is a single-layered structure, the opening 21 includes a first opening 24 and a second opening 25, and the first opening 24 is located between the second opening 25 and the substrate 10; the second opening 25 is defined above the first opening 24, and the aperture diameter of the second opening 25 is larger than the aperture diameter of the first opening 24. The horizontal distance L1 from the upper edge of the sidewall of the second opening 25 to the pad 11 ranges from 60 μm to 100 μm, and the horizontal distance L2 from the upper edge of the sidewall of the first opening 24 to the pad 11 ranges from 20 μm to 40 μm.

In yet another embodiment, referring to FIG. 3, the white oil layer 20 includes a first white oil layer 22 and a second white oil layer 23, the first white oil layer 22 is located between the second white oil layer 23 and the substrate 10, the openings 21 include a first opening 24 and a second opening 25, the first opening 24 penetrates the first white oil layer 22 and exposes the pad 11, and the second opening 25 penetrates the second white oil layer 23 and is defined above the first opening 24. The thickness of the first white oil layer 22 ranges from 20 μm to 30 μm, the thickness of the second white oil layer 23 ranges from 20 μm to 30 μm, and a sum of the thicknesses of the first white oil layer 22 and the second white oil layer 23 ranges from 50 μm from 70 μm. In one embodiment, the aperture diameter of the second opening 25 is equal to the aperture diameter of the first opening 24. In another embodiment, the aperture diameter of the second opening 25 is larger than the aperture diameter of the first opening 24. As shown in FIG. 3, the maximum distance L1 between the projection of the sidewall of the first opening 24 on the substrate 10 and the pad 11 ranges from 20 μm to 40 μm, and the maximum distance L2 between the projection of the sidewall of the second opening 25 on the substrate 10 and the pad 11 ranges from 60 μm to 100 μm.

In one embodiment, the LED display panel further includes a white glue layer 40, and the white glue layer 40 is disposed in the opening 21 and surrounds the LED chip 30. The white glue layer 40 has high reflectivity, and the materials of the white glue layer 40 generally include thermosetting organic materials such as silica gel or epoxy glue, and highly reflective materials such as titanium dioxide or silver. Due to the design of the opening 21 of the white oil layer 20, there is a gap between the white oil layer 20 and the LED chip 30, which may impact the brightness of the LED display panel. Therefore, in this embodiment, the white glue layer 40 is arranged around the LED chip, and the reflection effect of the white glue layer 40 makes up for the decrease in reflectivity of the white oil layer 20 due to the opening, thus improving the brightness of the LED display panel.

Further, the white glue layer 40 fills the gap between the LED chip 30 and the white oil layer 20, especially the gap between the adjacent ones of the solder pins 31, the gap between the solder pins 31 and the white oil layer 20, and the gap between the chip 32 and the substrate 10. In this way, the white glue layer 40 has the effect of encapsulating the LED chip 30 at the same time, so that the connection between the LED chip 30, the substrate 10, and the white oil layers 20 is more secure, which is beneficial to improve the stability of the LED display panel.

In an embodiment, the LED display panel further includes a transparent encapsulation layer (not shown). The transparent encapsulation layer is disposed on the LED chip 30 and covers the LED chip 30, the white oil layer 20, the white glue layer 40, and the substrate 10, to play a role of encapsulating the LED display panel. In addition, the transparent encapsulation layer is in a transparent state, and does not affect the light-emitting effect of the LED chip.

Figure 4:
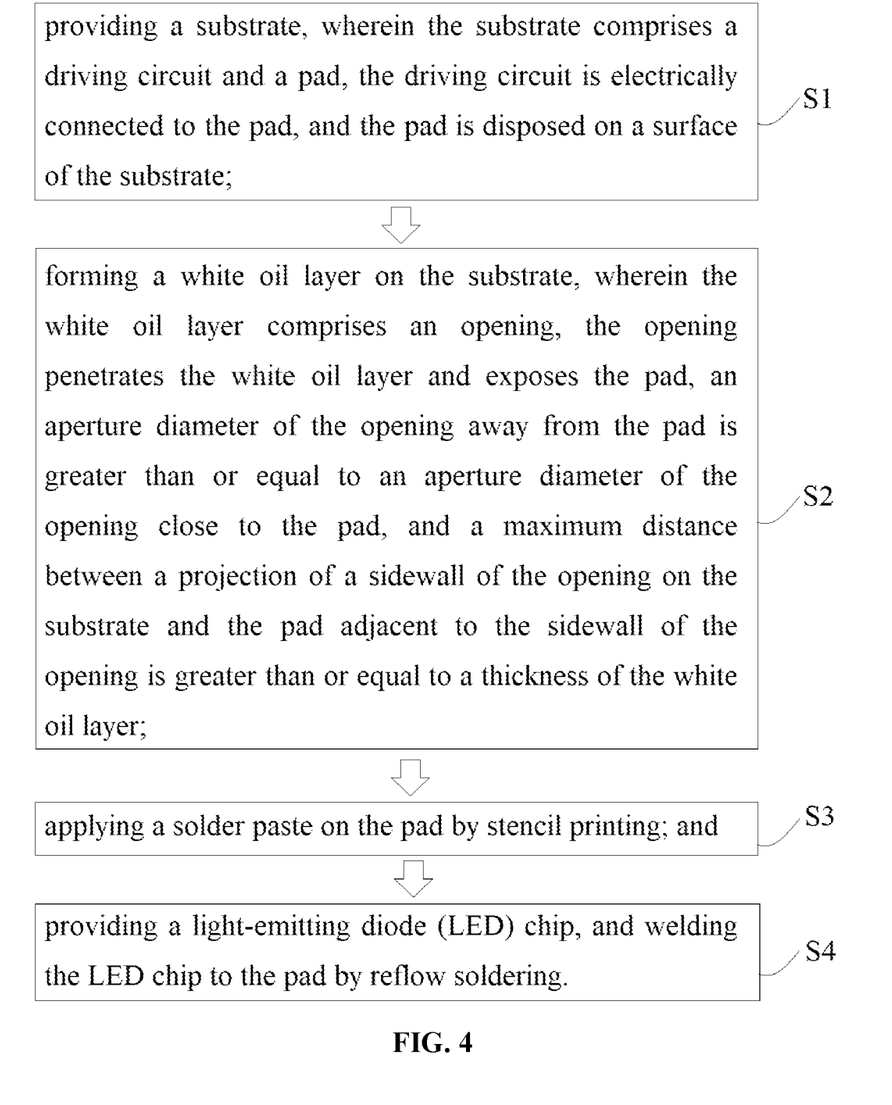
FIG. 4 is a flow chart of a process of manufacturing the LED display panel provided by the embodiment of the present application.
Figure 5:
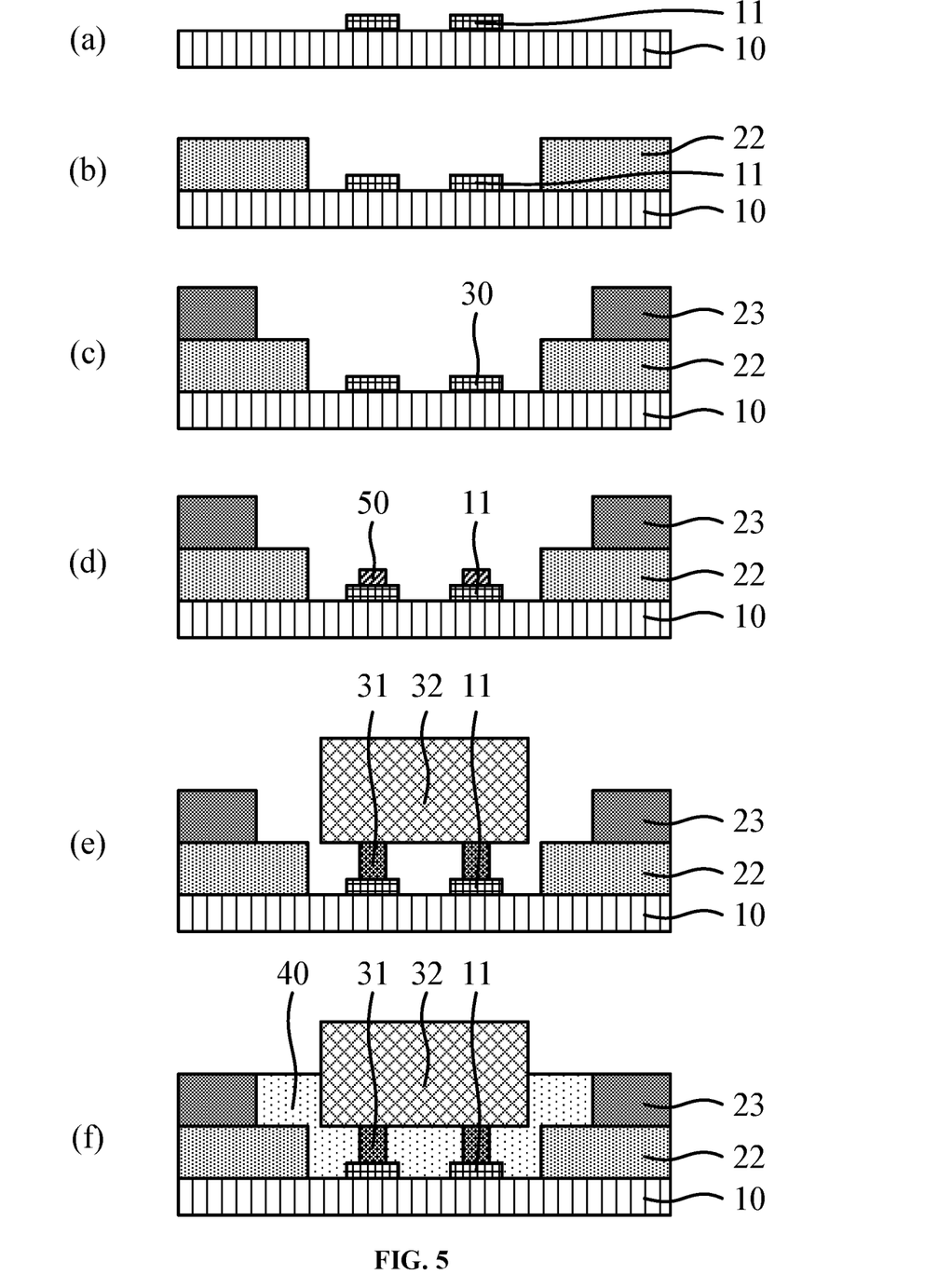
FIG. 5 is a schematic structural diagram of a process of manufacturing an LED display panel provided by an embodiment of the present application.

Correspondingly, the present application also provides a method of manufacturing an LED display panel, referring to FIG. 4 and FIG. 5, FIG. 4 shows a flow chart of the manufacturing of the LED display panel provided by the embodiment of the present application, and FIG. 5 shows a schematic structural diagram of a process of manufacturing an LED display panel provided by an embodiment of the present application. As shown in FIG. 4 and FIG. 5, the manufacturing method includes:

Step S1, providing a substrate, wherein the substrate includes a driving circuit and a pad, the driving circuit is electrically connected to the pad, and the pad is disposed on a surface of the substrate.

Step S2, forming a white oil layer on the substrate, wherein the white oil layer includes an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer.

Step S3, applying a solder paste on the pad by stencil printing.

Step S4, providing a light-emitting diode (LED) chip, and soldering the LED chip to the pad by reflow soldering.

In step S1, the step of providing the substrate is specifically shown in FIG. 5(a).

In one embodiment, in step S2, the step of forming the white oil layer on the substrate specifically includes:

A first white oil layer 22 is prepared on the substrate, as shown in FIG. 5(b). Specifically, it includes: coating a material of the first white oil layer 22 on the substrate 10 through a stencil printing process, and a thickness of the first white oil layer 22 ranges from 20 μm to 30 μm; pre-curing the first white oil layer 22; exposing the first white oil layer 22 by using a first film; and developing and etching the first white oil layer 22 to obtain a first opening 24, wherein the first opening 24 penetrates through the first white oil layer 22, and a horizontal distance L2 from the first opening 24 to the pad 11 ranges from 20 to 40 μm.

A second white oil layer 23 is prepared on the first white oil layer 22, as shown in FIG. 5(c). Specifically, it includes: coating a material of the second white oil layer 23 on the first white oil layer 22 through a stencil printing process, and the thickness of the second white oil layer 23 ranges from 20 to 30 μm; pre-curing the second white oil layer 23; exposing the second white oil layer 23 by using a second film; and developing and etching the second white oil layer 23 to obtain a second opening 25, wherein the second opening 25 penetrates through the second white oil layer 23, the second opening 25 is defined above the first opening 24, and the horizontal distance L1 from the second opening 25 to the pad 11 ranges from 60 μm to 100 μm.

In this embodiment, the stencil printing process is used to coat the material of the white oil layer. Since the thickness of the layer printed by the stencil printing process is usually not more than 40 μm, it is necessary to perform two white oil layer coating operations successively, so that a sum of the thicknesses of the first white oil layer 22 and the second white oil layer 23 reaches 50 μm to 70 μm. In addition, the stencil printing process has the advantage of fast speed and low cost compared to other coating processes.

In this embodiment, the first white oil layer 22 and the second white oil layer 23 are exposed to light by using a film. Compared with a chrome mask, the film has extremely low cost and greatly reduces the production cost of the white oil layer 20.

In another embodiment, in step S2, the step of forming a white oil layer on the substrate specifically includes:
coating a material of the white oil layer on the substrate, wherein the thickness of the white oil layer is 50-70 μm;
pre-curing the white oil layer;

The opening is opened on the white oil layer by an etching process; an aperture diameter of the opening is the same everywhere or an aperture diameter of the opening gradually increases in the direction away from the pad, and the horizontal distance from the upper edge of the sidewall of the opening to the pad is in the range of 60 μm to 100 μm, and the horizontal distance from the lower edge of the sidewall of the opening to the pad is greater than 20 μm, as shown in FIG. 1.

In this embodiment, the white oil layer 20 can be prepared by one coating process using inkjet printing, spin coating, and other processes, which reduces one coating process compared to the previous embodiment. In this embodiment, the white oil layer 20 is subject to one exposure process using a mask, and then the exposed white oil layer 20 is developed to obtain the openings; similarly, compared with the previous embodiment, the etching process is simplified, and one exposure process and one developing process are reduced.

In yet another embodiment, in step S2, the step of forming the white oil layer on the substrate specifically includes:
coating a layer of white oil material on the substrate; and
pre-curing the white oil layer.

The opening is formed in the white oil layer by one grayscale mask etching process or two etching processes; the opening includes a first opening and a second opening, and the first opening is located between the second opening and the substrate, the second opening is defined above the first opening, and the aperture diameter of the second opening is larger than the aperture diameter of the first opening, and the horizontal distance from the upper edge of the sidewall of the second opening to the pad is in the range of 60 μm to 100 μm, and the horizontal distance from the upper edge of the sidewall of the first opening to the pad is in the range of 20 μm to 40 μm, as shown in FIG. 2.

In this embodiment, the white oil layer 20 can be prepared by one coating process using inkjet printing, spin coating, or the like, or can be obtained by two coating processes using stencil printing. The opening can be obtained by performing one exposure process and etching by using a grayscale mask, or by performing two exposure processes and etching by using a conventional mask plate or a film.

In step S3, the stencil printing is used to coat the solder paste on the pad, as shown in FIG. 5(d). Since the horizontal distance L1 from the second opening 25 to the pad 11 is increased to 60-100 μm, which is greater than the thickness of the white oil layer 20, when the stencil printing is used to coat the solder paste, the stencil and the substrate 10 can achieve good direct contact to facilitate the coating of the solder paste 50 on the pad 11, and prevent a problem of abnormal solder paste printing due to an excessive thickness of the white oil layer, thereby preventing a problem of abnormal soldering between the substrate and the LED chip.

In step S4, an LED chip is provided, and the LED chip is soldered to the pad by reflow soldering, as shown in FIG. 5(e).

Further, after step S4, the manufacturing method further includes: forming a white glue layer in the opening, as shown in FIG. 5(f). The manufacturing of the white glue layer in the opening is to use a glue dispensing process to coat a layer of white glue material in the opening 21, the white glue material surrounds the LED chip 30, and preferably the white glue material fills a gap between the LED chip 30 and the white oil layer 20. The white glue material generally includes thermosetting organic materials such as silica gel or epoxy glue, and highly reflective materials such as titanium dioxide or silver.

After the white glue layer is prepared, the manufacturing method further includes: forming a transparent encapsulation layer, the transparent encapsulation layer covering the LED chip 30, the white oil layer 20, the white glue layer 40, and the substrate 10.

An embodiment of the present application further provides a display device, where the display device includes the LED display panel provided by any one of the embodiments of the present application. Since the display device includes the LED display panel provided by any of the embodiments of the present application, the display device has the technical features and beneficial effects of the LED display panel provided by any of the embodiments of the present application, which will not be repeated herein for brevity.

To sum up, the embodiments of the present application provide an LED display panel, a manufacturing method thereof, and a display device. By designing the white oil layer in the LED display panel to increase a size of an opening of the white oil layer, a maximum distance between a projection of a sidewall of the opening on the substrate and the pad adjacent to the sidewall of the opening is greater than or equal to a thickness of the white oil layer, which facilitates a contact between a stencil and the substrate during a stencil printing process and prevents a problem of abnormal solder paste printing due to an excessive thickness of the white oil layer, thereby preventing a problem of abnormal soldering between the substrate and the LED chip.

The LED display panel, the manufacturing method thereof, and the display device provided by the embodiments of the present application have been described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A light-emitting diode (LED) display panel, comprising:
    a substrate comprising a driving circuit and a pad, wherein the driving circuit is electrically connected to the pad, and the pad is disposed on a surface of the substrate;
    a white oil layer disposed on a side of the substrate where the pad is located; and
    a light-emitting diode (LED) chip welded with the pad by a solder paste;
    wherein the white oil layer comprises an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer,
    wherein the maximum distance between a projection of a sidewall of the opening on the substrate and the pad adjacent to the sidewall of the opening ranges from 60 microns to 100 microns, and the thickness of the white oil layer ranges from 50 microns to 70 microns.

2. The LED display panel according to claim 1, wherein the opening comprises a first opening and a second opening, the first opening is defined between the second opening and the substrate, and the second opening is defined above the first opening, and an aperture diameter of the second opening is larger than an aperture diameter of the first opening.

3. The LED display panel according to claim 2, wherein the white oil layer is disposed as a single layer; or
    the white oil layer comprises a first white oil layer and a second white oil layer, the first white oil layer is disposed between the second white oil layer and the substrate, the first opening penetrates the first white oil layer, and the second opening penetrates the second white oil layer.

4. The LED display panel according to claim 3, wherein a thickness of the first white oil layer is 20-30 microns, and a thickness of the second white oil layer is 20-30 microns.

5. The LED display panel according to claim 1, wherein the aperture diameter gradually increases in a direction away from the pad.

6. The LED display panel according to claim 1, wherein the LED display panel further comprises a white glue layer, the white glue layer is disposed in the opening and surrounds the LED chip, and the white glue layer fills a gap between the LED chip and the white oil layer.

7. The LED display panel according to claim 6, wherein a material of the white glue layer comprises titanium oxide or silver.

8. The LED display panel according to claim 6, wherein the LED display panel further comprises a transparent encapsulation layer, and the transparent encapsulation layer is disposed on the LED chip and covers the LED chip, the white oil layer, and the substrate.

9. A method of manufacturing a light-emitting diode (LED) display panel, comprising:
    providing a substrate, wherein the substrate comprises a driving circuit and a pad, the driving circuit is electrically connected to the pad, and the pad is disposed on a surface of the substrate;
    forming a white oil layer on the substrate, wherein the white oil layer comprises an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer;
    applying a solder paste on the pad by stencil printing; and
    providing a light-emitting diode (LED) chip, and welding the LED chip to the pad by reflow soldering,
    wherein the maximum distance between a projection of a sidewall of the opening on the substrate and the pad adjacent to the sidewall of the opening ranges from 60 microns to 100 microns, and the thickness of the white oil layer ranges from 50 microns to 70 microns.

10. The manufacturing method according to claim 9, wherein the step of forming the white oil layer on the substrate comprises:
    forming a first white oil layer on the substrate, wherein the first white oil layer comprises a first opening, and the first opening penetrates the first white oil layer and exposes the pad; and
    forming a second white oil layer on the first white oil layer, wherein the second white oil layer comprises a second opening, and the second opening penetrates the second white oil layer and is defined above the first opening,
    wherein a maximum distance between a projection of a sidewall of the first opening on the substrate and the pad is L2, a maximum distance between a projection of a sidewall of the second opening on the substrate and the pad is L1, and L1>L2.

11. A display device, wherein the display device comprises:
    a light-emitting diode (LED) display panel; and
    a back frame, wherein the display panel is disposed in an accommodating cavity of the back frame;

wherein the LED display panel comprises:
a substrate comprising a driving circuit and a pad, wherein the driving circuit is electrically connected to the pad, and the pad is disposed on a surface of the substrate;
a white oil layer disposed on a side of the substrate where the pad is located; and
a light-emitting diode (LED) chip welded with the pad by a solder paste;
wherein the white oil layer comprises an opening, the opening penetrates the white oil layer and exposes the pad, an aperture diameter of the opening away from the pad is greater than or equal to an aperture diameter of the opening close to the pad, and a maximum distance between a projection of a sidewall of the opening on the substrate and the pad adjacent to the sidewall of the opening is greater than or equal to a thickness of the white oil layer,
wherein the maximum distance between a projection of a sidewall of the opening on the substrate and the pad adjacent to the sidewall of the opening ranges from 60 microns to 100 microns, and the thickness of the white oil layer ranges from 50 microns to 70 microns.

12. The display device according to claim 11, wherein the opening comprises a first opening and a second opening, the first opening is defined between the second opening and the substrate, and the second opening is defined above the first opening, and an aperture diameter of the second opening is larger than an aperture diameter of the first opening.

13. The display device according to claim 12, wherein the white oil layer is disposed as a single layer; or
the white oil layer comprises a first white oil layer and a second white oil layer, the first white oil layer is disposed between the second white oil layer and the substrate, the first opening penetrates the first white oil layer, and the second opening penetrates the second white oil layer.

14. The display device according to claim 13, wherein a thickness of the first white oil layer is 20-30 microns, and a thickness of the second white oil layer is 20-30 microns.

15. The display device according to claim 11, wherein the aperture diameter gradually increases in a direction away from the pad.

16. The display device according to claim 11, wherein the LED display panel further comprises a white glue layer, the white glue layer is disposed in the opening and surrounds the LED chip, and the white glue layer fills a gap between the LED chip and the white oil layer.

17. The display device according to claim 16, wherein a material of the white glue layer comprises titanium oxide or silver.

18. The display device according to claim 16, wherein the LED display panel further comprises a transparent encapsulation layer, and the transparent encapsulation layer is disposed on the LED chip and covers the LED chip, the white oil layer, and the substrate.

* * * * *